United States Patent [19]

Bertotti et al.

[11] 4,245,209
[45] Jan. 13, 1981

[54] VOLTAGE DIVIDER INCLUDING A TAPPED RESISTOR DIFFUSED IN SEMICONDUCTOR SUBSTRATE

[75] Inventors: Franco Bertotti, Milan; Fausto Catellani, Correggio; Giuseppe Gavioli, Modena, all of Italy

[73] Assignee: SGS-ATES Componenti Elettronici S.p.A., Agrate Brianza, Italy

[21] Appl. No.: 46,602

[22] Filed: Jun. 8, 1979

[30] Foreign Application Priority Data

Jun. 13, 1978 [IT] Italy ................. 24992 A/78

[51] Int. Cl.³ .............................................. H01C 3/08
[52] U.S. Cl. ...................................... 338/217; 357/51
[58] Field of Search ............. 338/217, 140, 138, 142, 338/308, 309, 323–325, 333, 334; 357/51, 20; 323/94 R

[56] References Cited
U.S. PATENT DOCUMENTS 3,666,995  5/1972  Wensink et al. ................. 357/51 X
4,181,878  1/1980  Murari et al. ..................... 323/94 R

*Primary Examiner*—C. L. Albritton
*Attorney, Agent, or Firm*—Karl F. Ross

[57] ABSTRACT

A resistor is formed in a monocrystalline silicon substrate by the diffusion of impurities to a substantially constant depth in an elongate surface zone with metallized opposite ends constituting terminals for the passage of a current therethrough. The zone is relatively narrow in the vicinity of these terminals and broadens at an intermediate location to form a corner or a bulge on one side of its longitudinal median. Several taps, in the form of branches of like conductivity transverse to the lateral boundary of the zone, are spacedly disposed along that corner or bulge at and near a region in which the cross-sectional area of the zone is a maximum and its resistance per unit length, measured at the median, is lowest; thus, the potential difference between the metallized extremities of any two adjoining taps is a small fraction of the overall voltage drop between the terminals.

6 Claims, 2 Drawing Figures

VOLTAGE DIVIDER INCLUDING A TAPPED RESISTOR DIFFUSED IN SEMICONDUCTOR SUBSTRATE

FIELD OF THE INVENTION

Our present invention relates to a voltage divider comprising a tapped resistor formed by the diffusion of impurities into an elongate surface zone of a semiconductor substrate such as a wafer of monocrystalline silicon.

BACKGROUND OF THE INVENTION

When such a resistor is traversed by current, predetermined fractions of the overall voltage difference existing between its terminals are available at the several taps. The latter may be constituted by metallic strips placed across the doped zone of the substrate at longitudinally spaced locations. Another possibility is to extend lateral branches from that zone by diffusing impurities—usually identical with those of the zone itself—into adjacent areas and metallizing the extremities of these branches. If the taps thus formed are connected to loads of high resistance (such as, for example, the inputs of operational amplifiers), they will draw only negligible current so as not significantly to affect the overall voltage drop.

In certain instances it is necessary to make the open-circuit potential difference between adjacent taps a very small fraction of that overall voltage drop. Such a situation arises, for example, when a reference potential is to be applied to a resistance bridge requiring compensation of an offset voltage due to an inherent unbalance. It then becomes necessary to choose among several reference voltages differing but little from one another, e.g. by about 1 to 3 mV.

For physical reasons, metal contacts overlying a diffused resistor defined by an elongate zone of predetermined conductivity cannot be spaced close enough to supply voltage differences of this small order of magnitude. The same is true of taps formed by lateral branches extending on one side of the longitudinal median of the zone. If these branches are disposed at opposite sides of the median, their potential difference in the presence of a constant current of a given magnitude could be chosen as small as desired; such positioning, however, is inconvenient in certain instances, as where the selected tap is to be linked to an external load by a lead of predetermined length.

OBJECT OF THE INVENTION

The object of our present invention, accordingly, is to provide a voltage divider of the above-discussed type including a diffused resistor with taps so disposed along one lateral boundary thereof that the potential difference between any two adjoining taps is a small fraction of the overall voltage drop.

SUMMARY OF THE INVENTION

We realize this object, in accordance with our present invention, by so shaping the doped elongate zone of the substrate that the diffused resistor defined by that zone has a width which varies from two relatively narrow sections adjacent its metallized ends to a relatively broad intermediate section with an outwardly projecting lateral boundary on one section of the longitudinal median of the zone, that intermediate section defining a region of maximum cross-sectional area and minimum resistance per unit length measured along the median. Within that region, the intermediate section of the doped zone is provided with a plurality of closely juxtaposed branches of substantially the same resistivity extending perpendicularly from the outwardly projecting lateral boundary thereof, these branches terminating in metallized extremities forming taps whose potentials differ by a small fraction of the voltage drop existing between the ends of the zone in the presence of a current flow through the resistor.

It will generally be convenient to make the depth of the doped zone substantially constant throughout its length and width; the branches, if formed in the same diffusion process, will also be of that depth.

BRIEF DESCRIPTION OF THE DRAWING

The above and other features of our invention will now be described in detail with reference to the accompanying drawing in which.

SPECIFIC DESCRIPTION

Figure 1:
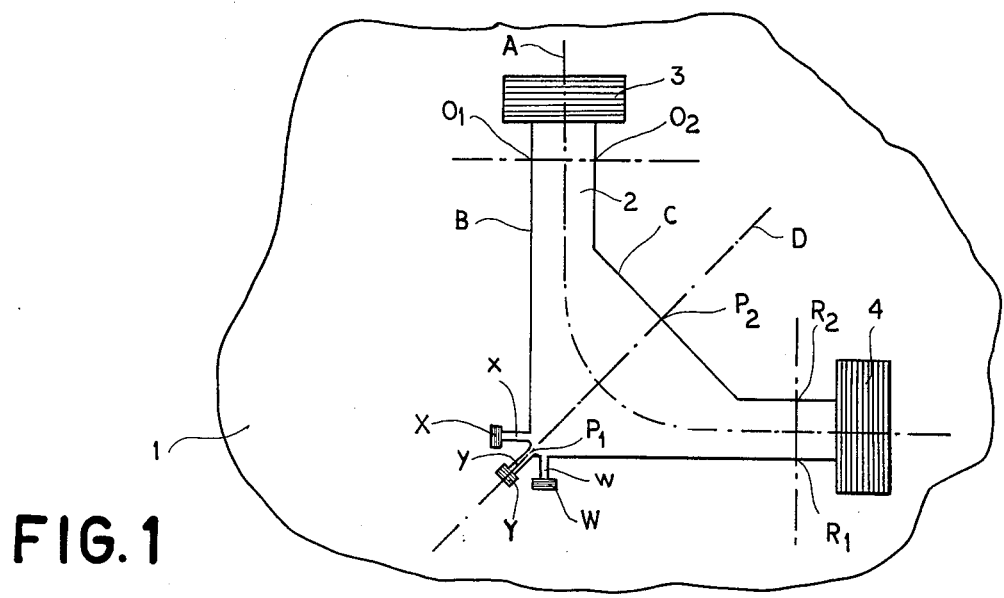
FIG. 1 is a plan view of a portion of a silicon wafer provided with a diffused resistor according to our invention.

In FIG. 1 we have shown part of a wafer 1 of monocyrstalline silicon which may be of intrinsic conductivity or only lightly doped so as to have a very high electrical resistance. An elongate zone 2 (not drawn to scale) of predetermined lower resistivity is formed by conventional doping with suitable impurities to constitute a diffused resistor. Opposite ends 3 and 4 of the zone 2 are metallized to serve as terminals to be connected across a current source.

Zone 2 has lateral boundaries B and C on opposite sides of its longitudinal median A. These boundaries extend parallel to each other in the vicinity of terminals 3 and 4 so as to establish two narrow resistor sections of constant width separated by an intermediate resistor section of progressively increasing and then progressively decreasing width. The spacing of opposite points $O_2$, $O_2$, and $R_1$, $R_2$ at the narrow sections is about half the distance between points $P_1$ and $P_2$ which are interconnected by a transverse line D in the region of maximum width. Point $P_1$ on boundary B forms a sharp corner, here of 90°, and lies at the junction of that boundary with a transverse branch y centered on line D and flanked by two other branches x and w which extend perpendicularly to boundary B on opposite sides of corner $P_1$. The three branches x, y and w, diverging from one another at 45°, have metallized extremities X, Y and W at which their voltages can be taken off.

With zone 2 assumed to have a constant depth, its cross-sectional area is largest in the transverse plane coinciding with line D so that the voltage drop per unit length measured along median A is smallest in the immediate vicinity of this line. Furthermore, since boundary B includes an angle of nearly 45° with the median at points close to corner $P_1$, the distances between taps x, y and between taps y, w are almost $\sqrt{2}$ times the lengths of their projections upon the median A. As a result, only small voltage differences exist along boundary B between the junctions of these branches with zone 2.

Figure 2:
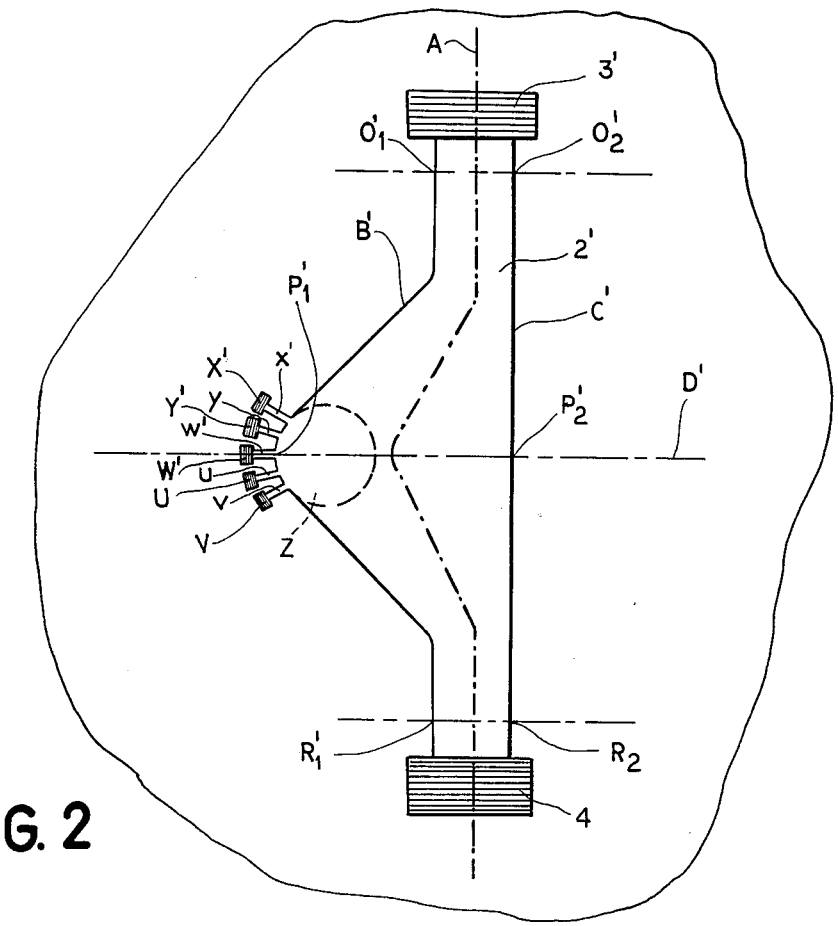
FIG. 2 is a view similar to FIG. 1, showing a modification.

In FIG. 2 we have shown the substrate 1 provided with a modified zone of diffusion 2' of generally linear configuration, having metallized terminals 3', 4'; on one side of its median A' it has a straight lateral boundary C' whereas its other lateral boundary B' diverges from boundary C' to form again a broadening intermediate resistor section between two narrow sections of constant width. That width, e.g. as measured between points $O_1'$, $O_2'$ and $R_1'$, $R_2'$, is shown to be less than half the maximum width existing between points $P_1'$ and $P_2'$ that are interconnected by a transverse line D' coinciding with the maximum cross-sectional area of the zone.

In the vicinity of point $P_1'$, boundary B' forms an arcuate bulge along the periphery of an imaginary circle z whose diameter is less than half of the maximum width, the radius of curvature of the bulge being thus less than one fourth of that width. Branches x', y', w', u and v extend perpendicularly to boundary B' along the arcuate bulge, the middle branch w' being centered on line D'. The free extremities of these branches are again metallized to form electrodes X', Y', W', U and V.

In this latter embodiment, in which the zone 2' is again assumed to be of constant depth, the width of that zone decreases less sharply in the vicinity of line D' compared with the width of zone 2 of FIG. 1 in the region of line D. This compensates for the fact that boundary B' is substantially parallel to median A' near the midpoint $P_1'$ of the bulge and converges only slightly toward that median in the vicinity of the outer branches x' and v. The advantage of the embodiment of FIG. 2 over that of FIG. 1 is, however, that a larger number of taps can be accommodated with small potential differences between them.

If desired, boundary C' of FIG. 2 could be made symmetrical to boundary B' with provision of additional taps in the region of line D'. The median A' would then follow a straight line. It would also be apparent that, with a decrease in the radius of circle z, boundary B' may approach in its intermediate section the angular shape of boundary B shown in FIG. 1.

We claim:

1. A voltage divider comprising a resistor formed in a highly resistive semiconductor substrate by the diffusion of impurities into an elongate surface zone thereof, said zone having metallized ends connectable across a current source and varying in width from two relatively narrow sections adjacent said ends to a relatively broad intermediate section with and outwardly projecting lateral boundary on one side of the longitudinal median of said zone, thereby defining a region of maximum cross-sectional area and minimum resistance per unit length measured along said median, said zone being provided along said intermediate section and within said region with a plurality of branches of substantially the same resistivity closely spaced from one another and perpendicular to said lateral boundary, said branches terminating in metallized extremities forming taps whose potentials differ by a small fraction of the voltage drop existing between said ends in the presence of a current flow through said resistor.

2. A voltage divider as defined in claim 1 wherein said zone is of substantially constant depth throughout its length and width.

3. A voltage divider as defined in claim 1 or 2 wherein said lateral boundary forms a corner bisected by a transverse plane in which said zone has its maximum width, said branches including a central branch at said corner and two other branches flanking said central branch.

4. A voltage divider as defined in claim 1 or 2 wherein said lateral boundary forms an arcuate bulge bisected by a transverse plane in which said zone has its maximum width, said branches being concentrated along said bulge.

5. A voltage divider as defined in claim 4 wherein said bulge has a radius of curvature smaller than one-fourth said maximum width.

6. A voltage divider as defined in claim 1 or 2 wherein said substrate consists of monocrystalline silicon.

* * * * *